(12) United States Patent
Potemkin

(10) Patent No.: US 9,650,249 B2
(45) Date of Patent: May 16, 2017

(54) METHOD FOR PRODUCING NANOCRYSTALS FROM PIEZOELECTRIC ALUMINIUM NITRIDE FOR SORPTION FILTERS

(76) Inventor: Alexander Potemkin, Barsbuettel (DE)

( * ) Notice: Subject to any disclaimer, the term of this patent is extended or adjusted under 35 U.S.C. 154(b) by 477 days.

(21) Appl. No.: 14/374,463

(22) PCT Filed: Jan. 25, 2012

(86) PCT No.: PCT/IB2012/000110
§ 371 (c)(1),
(2), (4) Date: Dec. 29, 2014

(87) PCT Pub. No.: WO2013/110964
PCT Pub. Date: Aug. 1, 2013

(65) Prior Publication Data
US 2015/0183640 A1    Jul. 2, 2015

(51) Int. Cl.
| | | |
|---|---|---|
| *C30B 25/00* | (2006.01) | |
| *C30B 29/40* | (2006.01) | |
| *C30B 29/62* | (2006.01) | |
| *C30B 29/60* | (2006.01) | |
| *B82Y 30/00* | (2011.01) | |
| *C01B 21/072* | (2006.01) | |

(52) U.S. Cl.
CPC ............ *C01B 21/072* (2013.01); *B82Y 30/00* (2013.01); *C01B 21/0722* (2013.01); *C30B 25/005* (2013.01); *C30B 29/403* (2013.01); *C30B 29/60* (2013.01); *C30B 29/62* (2013.01); *C01P 2004/16* (2013.01)

(58) Field of Classification Search
None
See application file for complete search history.

(56) References Cited

U.S. PATENT DOCUMENTS

| | | | |
|---|---|---|---|
| 3,653,830 A | 4/1972 | Komeya et al. | |
| 4,865,830 A * | 9/1989 | Klabunde | B82Y 30/00 423/290 |
| 5,457,173 A * | 10/1995 | Jensen | C01B 21/072 525/389 |
| 2008/0083970 A1* | 4/2008 | Kamber | C04B 35/581 257/615 |

OTHER PUBLICATIONS

International Preliminary Report on Patentability (PCT/IB/373), including Written Opinion (PCT/ISA/237) dated Jul. 29, 2014 with English translation (22 pages).
Congkang Xu et al.: "Formation and photoluminescence properties of AlNanowires", Physica Status Solidi (A), Bd. 198, Nr. 2, Aug. 1, 2003 (Aug. 1, 2003), pp. 329-335.

* cited by examiner

*Primary Examiner* — Guinever S Gregorio
(74) *Attorney, Agent, or Firm* — Crowell & Moring LLP

(57) ABSTRACT

A method for producing nanowires from piezoelectric aluminum nitride is provided. Nanowires formed from cubic AlN having a diameter of 10-20 A and a length of 1000-1500 A are obtained from a batch of Al+2-10% by volume AlH3 at a temperature of 1500-2300 K in a gaseous environment of $N_2$+(3-5% by volume $NH_3$) at a pressure of 200-2000 MPa.

4 Claims, No Drawings

METHOD FOR PRODUCING NANOCRYSTALS FROM PIEZOELECTRIC ALUMINIUM NITRIDE FOR SORPTION FILTERS

This application is a National Phase of PCT International Application No. PCT/IB2012/000110, filed Jan. 25, 2012, the entire disclosure of which is herein expressly incorporated by reference.

BACKGROUND AND SUMMARY OF THE INVENTION

The invention is directed to a nanocrystal production method.

The history of synthesizing nanowires made of compounds that are difficult to melt goes back to the 1970s, when it became known that as the cross-section of whiskers decreased their strength limit attained theoretical values. The practical utility of the whiskers became apparent when producing composite materials, high-strength and highly modular materials based on polymers, metals, ceramics, and graphite for novel materials. Whiskers made of silicon carbide and silicon nitride, aluminum oxide and aluminum nitride, etc., were mass-produced; they were studied not only due to their strength, but also from a functional standpoint—heat conductivity, piezoelectricity, electrocondensation, etc. Whiskers were grown from a solid batch of the basic element, to which were added compounds of the appropriate element that, when heated and at nearly atmospheric pressure (1.2 atm), easily convert in a reactive or inert milieu to the gaseous phase. Analysis of the dimensions obtained indicated that the dispersity of the whiskers in principle is a function of the size of the drop of the basic element on the surface of the seed crystal, whose growth is stimulated by the VLS (vapor-liquid-solid) mechanism and is practically impossible to control. The dimensions of most of the whiskers was in a range from 1-500 μm in diameter, with the vast majority having a diameter of 100-300 μm. Attempts to produce nanowhiskers at normal air pressure failed. Piezoelectric whiskers made of aluminum nitride with a cubic modification (patent 2016 298 RF SO 1 V 21/072) that were grown from the gaseous phase at 1100-1300° C. in a nitrogen or ammonia atmosphere from an Al+AlF$_3$ batch (patent 2136 587 RF SO 1 V 21/072 BI 1999 No. 25) aroused the greatest interest from a functional point of view. But keeping the diameter of the whiskers obtained in this manner below 0.15 μm proved not to be possible, and thus they made up just 1.5-2% by volume of the total product mass and their separation increased the cost of the whiskers 1000-fold. The attempt to grow AN nanowhiskers from the gas phase by depositing aluminum hydride on a hot substrate in a nitrogen atmosphere (Nanostruct. Mater. 1992, Vol. 4, p. 269) was responsible for only an insignificant increase in the yield of whiskers (less than 0.1-0.2% by volume) with a minimum diameter of 1000 Å.

Initial experiences with mass-produced whiskers made from aluminum nitride (Redkino chemicals factory, Moscow District) date back to the year 1975. They were used as heat insulation of the hot portion of a pressure chamber working under a nitrogen pressure of 200 MPa and at a temperature of 2000° C. We discovered that whiskers that were in next to the hot zone transformed by recrystallization from large 250 μm sizes to small sizes from 0.1 to 1 μm, and at a rate of 98%. Increasing the nitrogen pressure to 500 MPa at a temperature that remained the same reduced the diameter of the crystal only minimally to 0.1-0.5 μm.

The next experiment attempted to grow the whiskers from a batch comprising aluminum powder, with an aluminum hydride added, at a nitrogen pressure of 1000 MPa and a temperature of 2300 K. Of the crystals now obtained, 99% had a diameter of 10-70 Å. After impregnation with a gas mixture of He+30% O$_2$, there was high absorbability with respect to air with a portion of radioactive isotopes of xenon, cesium, etc.

The present invention is an improvement over the foregoing.

DETAILED DESCRIPTION

The following is an example embodiment of the method of the present invention.

1. The batch for growing the nanowires was produced in a vibration mill from SAP aluminum powder with an addition of AlH$_3$ solution in tetrahydrofurane (5 g/100 g) on the order of magnitude of 2-10% by volume within 30-45 minutes.
2. The finished batch was added to graphite containers made of fine-grained dense graphite (MPG) having a cross-section of 50×5 mm and a thickness of 1.5 mm in a max. 2 mm-thick layer.
3. The containers with the batch were placed on a frame on the specimen stage of the pressure chamber oven, subjected to a vacuum of 10$^{-2}$ Torr, helium having a 30% by volume admixture of oxygen was admitted up to a pressure of 100 atm, then the vacuum pressure was re-applied and the entire process was repeated three times, then the pressure of the nitrogen (with a 3-5% by volume addition of ammonia) was increased to 200-2000 MPa and the heater was turned on, the temperature was increased to 2000° C. at a speed of max. 10° C./min and held for 3-5 hours.
4. After this exposure concluded, pressure and temperature were reduced to normal values, the pressure chamber was subjected to a vacuum with a non-lubricant electrophysical pump at 10$^{-6}$ Torr, and then filled with a mixture of He+30% by volume O$_2$ up to a pressure of 200-2000 MPA and left in this condition for 30 minutes; after this, the pressure was reduced to atmospheric pressure and the containers with the nanowires were removed from the pressure chamber.
5. The nanowires that were removed have the appearance of cotton wadding and are packed between layers of Petryanov filter cloth and placed into an electrical field of 100-1000 V.
6. The nanowires are placed on the filter from the top containers that are applied to the inside of the filter facing the respiratory organs.
7. Analysis of the nanowires from the top and lower containers evidenced a strong difference in the increase in weight of the absorption components (He+30% by volume O2), by an average of 10-15%.
8. Measurement of the specific surface of the nanowires demonstrated that they fluctuate between 15000-35000 m/g as a function of the elevation of the containers.
9. The cross-section of the nanowires that were grown is also a function of the elevation of the container and according to data from the electron microscope is 10-20 Å for 99% of the batch volume.
10. The determination of the capacitive charge on the inside of the filter evidenced distribution of the measured values between 0.8-0.95 Q, which is apparently caused by the different specific surface of the nanowires and consequently of the absorbed quantity of He+O2.

11. The crystal density, calculated with the Lauegram of a highly focused electron bundle of the microscope with a voltage of 1 million volts was 3.2-3.25 g/cm3, which means a cubic lattice type.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

The invention claimed is:

1. A method for producing nanowires from piezoelectric aluminum nitride, comprising the acts of:
   generating cubic AlN from by subjecting Al+2-10% by volume $AlH_3$ in a gaseous atmosphere of $N_2$+(3-5% by volume $NH_3$) to a temperature of 1500-2300° K under a pressure of 200-2000 MPa; and
   growing nanowires having a diameter of 10-20 Å and a length of 1000-1500 Å from the generated cubic AlN.

2. The method in accordance with claim 1, further comprising the act of:
   generating the Al+2-10% by volume $AlH_3$ from a SAP powder aluminum by addition of $AlH_3$ solution in tetrahydrofurane (5 g/100 g) between 2-10% by volume in a graphite container having a cross-section of 50×10 mm.

3. The method in accordance with claim 2, wherein the act of generating the cubic AlN includes the acts of
   placing the graphite container containing the SAP powder aluminum into a pressure chamber,
   conducting a plurality of rinses with a mixture of helium and oxygen, increasing a pressure in the pressure chamber with a mixture of $N_2$+(3-5% by volume $NH_3$) to 200-2000 MPa,
   increasing a temperature in the pressure chamber to 2000° K at a rate of no more than 10° C./minute, and
   maintaining the increased temperature for 3-5 hours.

4. The method in accordance with claim 3, wherein the act of generating the cubic AlN includes
   after the 2000° K exposure, cooling and reducing pressure,
   applying a vacuum of $10^{-6}$ Torr,
   filling the pressure chamber with a mixture of helium+ 30% by volume oxygen to a pressure of 200-2000 MPa for 30 minutes,
   reducing the pressure chamber pressure to atmospheric pressure,
   opening the chamber, and
   removing the AlN crystals.

* * * * *